United States Patent
Jeong et al.

(10) Patent No.: US 9,830,848 B2
(45) Date of Patent: Nov. 28, 2017

(54) VOLTAGE GENERATION INTEGRATED CIRCUIT AND DISPLAY APPARATUS HAVING THE SAME

(71) Applicant: Samsung Display Co., Ltd., Yongin (KR)

(72) Inventors: Jae-Won Jeong, Seoul (KR); Hyun Seok Hong, Asan-si (KR); Young-Su Kim, Daegu (KR); Jinhyun Ko, Yongin-si (KR); Hyelim Kim, Seongnam-si (KR); Kyung-Uk Choi, Gunpo-si (KR); Sangyoung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 354 days.

(21) Appl. No.: 14/297,192

(22) Filed: Jun. 5, 2014

(65) Prior Publication Data

US 2015/0116298 A1    Apr. 30, 2015

(30) Foreign Application Priority Data

Oct. 30, 2013    (KR) .................. 10-2013-0130514

(51) Int. Cl.
| | |
|---|---|
| G09G 5/00 | (2006.01) |
| G09G 3/20 | (2006.01) |
| H03K 17/04 | (2006.01) |
| G09G 3/00 | (2006.01) |

(52) U.S. Cl.
CPC ........... *G09G 3/2092* (2013.01); *G09G 3/006* (2013.01); *H03K 17/04* (2013.01); *G09G 2320/041* (2013.01)

(58) Field of Classification Search
USPC ....................................... 345/212
See application file for complete search history.

(56) References Cited

U.S. PATENT DOCUMENTS

| | | | |
|---|---|---|---|
| 5,646,572 A | 7/1997 | Masleid | |
| 7,310,213 B2 | 12/2007 | Takada | |
| 8,258,766 B1 | 9/2012 | Sutardja | |
| 2008/0246702 A1* | 10/2008 | Lee | G09G 3/3233 345/77 |
| 2012/0062526 A1 | 3/2012 | Wen et al. | |
| 2013/0148409 A1 | 6/2013 | Chung | |

FOREIGN PATENT DOCUMENTS

| | | |
|---|---|---|
| JP | 2002-312415 | 10/2002 |
| KR | 10-0940028 | 2/2010 |

\* cited by examiner

*Primary Examiner* — Gustavo Polo
(74) *Attorney, Agent, or Firm* — H.C. Park & Associates, PLC (57) ABSTRACT

An exemplary embodiment of the present invention discloses a voltage generation circuit of a display apparatus, including at least one resistor, a memory configured to store a resistance value set signal, a controller changing a resistance value of the resistor referring to the resistance value set stored in the memory, and a voltage generator connected to one end of the resistor and is configured to receive an input current corresponding to the resistance value of the resistor and generate a gate-on voltage corresponding to the input current.

16 Claims, 7 Drawing Sheets

VOLTAGE GENERATION INTEGRATED CIRCUIT AND DISPLAY APPARATUS HAVING THE SAME

CROSS-REFERENCE TO RELATED APPLICATION

This application claims priority from and the benefit of Korean Patent Application No. 10-2013-0130514, filed on Oct. 30, 2013, which is hereby incorporated by reference for all purposes as if fully set forth herein.

BACKGROUND

Field

Exemplary embodiments of the present disclosure relate to a voltage generation integrated circuit and a display apparatus having the same.

Discussion of the Background

In general, a display apparatus includes a display panel to display an image and data and gate driving circuits to drive the display panel. The display panel includes gate lines, data lines, and pixels. Each pixel includes a switching transistor, a liquid crystal capacitor, and a storage capacitor. The data driving circuit applies a data driving signal to the data lines and the gate driving circuit applies a gate driving signal to the gate lines.

The display apparatus applies a gate-on signal to a gate electrode of the switching transistor connected to the gate line and applies a data voltage to a source electrode of the switching transistor, thereby displaying a desired image.

In recent years, the gate driving circuit is realized using an amorphous silicon gate circuit including an amorphous silicon thin film transistor. The gate driving circuit realized using the amorphous silicon gate circuit includes transistors. A mobility of an electron in the transistors of the gate driving circuit is influenced by surrounding temperature. That is, when the surrounding temperature is increased, the mobility of the electron in the transistors becomes high, and when the surrounding temperature is decreased, the mobility of the electron in the transistors becomes low. Since the mobility of the electron exerts influence on driving capability of the transistors, the mobility of the electron should be compensated to increase driving speed of the transistor.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide a voltage generation integrated circuit capable of generating an operating voltage to compensate for a surrounding temperature.

Additional features of the invention will be set forth in the description which follows, and in part will be apparent from the description, or may be learned by practice of the invention.

An exemplary embodiment of the present invention discloses a voltage generation integrated circuit, including at least one resistor, a memory configured to store a resistance value set, a controller that changes a resistance value of the resistor referring to the resistance value set signal stored in the memory, and a voltage generator connected to one end of the resistor and is configured to receive an input current corresponding to the resistance value of the resistor and generate a gate-on voltage corresponding to the input current.

An exemplary embodiment of the present invention discloses a display apparatus, including a display panel including a plurality of gate lines, a plurality of data lines, and a plurality of pixels connected to the gate lines and the data lines, an image display controller that converts an image signal received from an external source to a data signal and configured to control the display panel to display an image on the display panel, and a voltage generator that generates a voltage to drive the image display controller. The voltage generator includes at least one resistor, a memory that stores a resistance value set, a controller that changes a resistance value of the resistor referring to the resistance value set stored in the memory, and a voltage generator connected to one end of the one resistor and is configured to receive an input current corresponding to the resistance value of the one resistor and generate a gate-on voltage corresponding to the input current.

An exemplary embodiment of the present invention also discloses A testing system to set characteristics of a display apparatus, including a computer configured to output a temperature control signal and a voltage control signal, an interface board connected between the computer and the display apparatus, wherein the interface board is configured to convert a voltage control signal received from the computer to a voltage control signal and transmit the voltage control signal into the display apparatus, a temperature chamber configured to set the temperature in the temperature chamber in response to the temperature control signal from the computer, and an oscilloscope configured to measure a gate-on voltage generated from the display apparatus and provide a wave information about the gate-on voltage to the computer.

According to the above, the variable resistors are included in the voltage generator, and thus the number of components mounted on the circuit board may be reduced. In addition, the resistance values of the variable resistors included in the voltage generator may be automatically controlled. Therefore, the time controlling the resistance values of the variable resistors may be shortened, and the compensation operation of the voltage generator may be accurately performed in accordance with the variation of the surrounding temperature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 1:
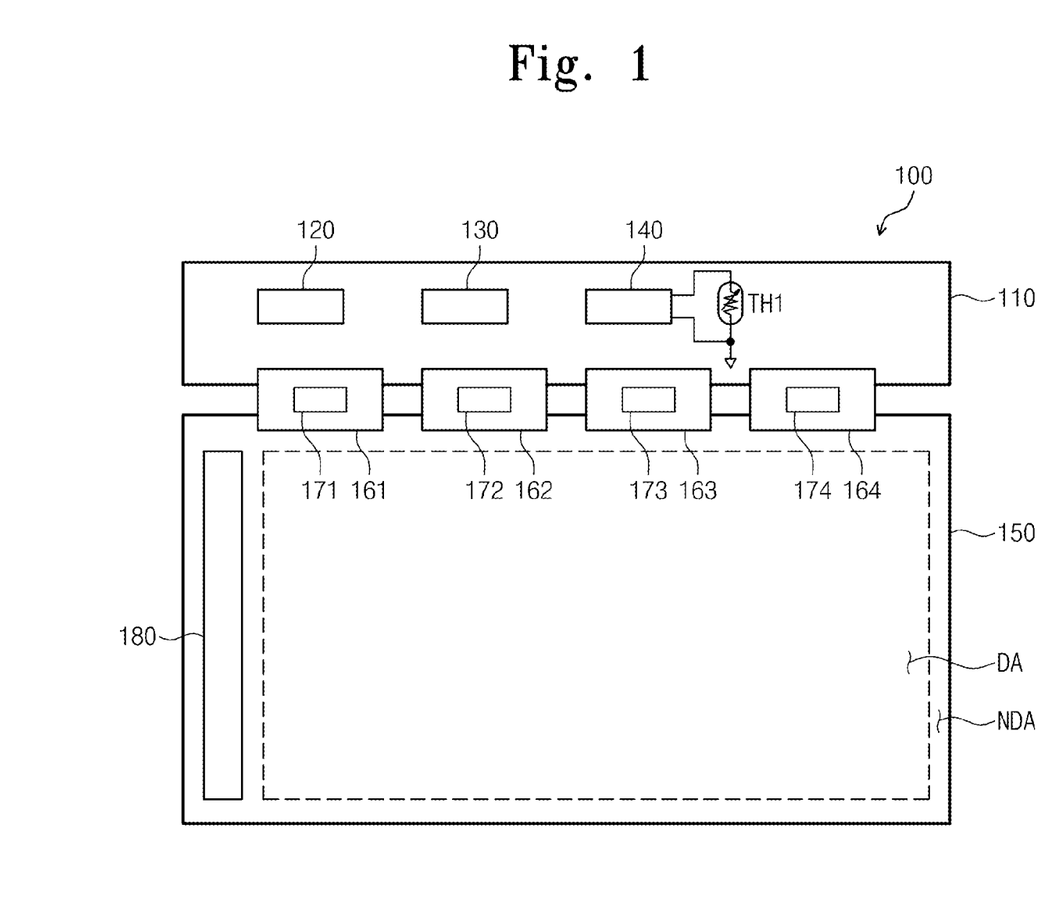
FIG. 1 is a plan view showing a display apparatus according to an exemplary embodiment of the present disclosure.

FIG. 1 is a plan view showing a display apparatus according to an exemplary embodiment of the present disclosure.

Referring to FIG. 1, a display apparatus 100 includes a circuit board 110, a display panel 150, data driving circuits 161 to 164, and a gate driving circuit 180.

The display apparatus 100 may a liquid crystal display (LCD), a plasma panel display (PDP), an organic light emitting diode display (OLED), or a field emission display (FED).

The circuit board 110 includes a timing controller 120, a clock generator 130, a voltage generator 140, and a thermistor TH1. The thermistor TH1 is mounted on the circuit board 110 and electrically connected to the voltage generator 140. Each of the timing controller 120, the clock generator 130, and the voltage generator 140 is realized as an integrated circuit and mounted on the circuit board 110. The circuit board 110 may further include various circuits to drive the display panel 150 in addition to the timing controller 120, the clock generator 130, the voltage generator 140, and the thermistor TH1.

Each of the data driving circuits 161 to 164 may be realized as a tape carrier package (TCP) or a chip on film (COF), and data driving integrated circuits 171 to 174 are mounted on the data driving circuits 161 to 164, respectively. Each of the data driving integrated circuits 171 to 174 drives a plurality of data lines disposed on the display panel 150 in response to a data signal and a control signal, which are applied from the timing controller 120. According to embodiments, the data driving integrated circuits 171 to 174 may be directly mounted on the display panel 150.

The display panel 150 includes a display area DA in which a plurality of pixels PX is arranged and a non-display area NDA disposed adjacent to the display area DA. The display area DA is an area in which an image is displayed, and the non-display area NDA is an area in which the image is not displayed. The display panel 150 may include a glass substrate, a silicon substrate, or a film substrate.

The gate driving circuit 180 may be configured in a circuit using an amorphous silicon gate of an amorphous silicon thin film transistor (a-Si TFT), an oxide semiconductor, a crystalline semiconductor, a polycrystalline semiconductor, etc., and integrated in the non-display area NDA of the display panel 150. The gate driving circuit 180 may be disposed at one side of the display panel 150.

Figure 2:
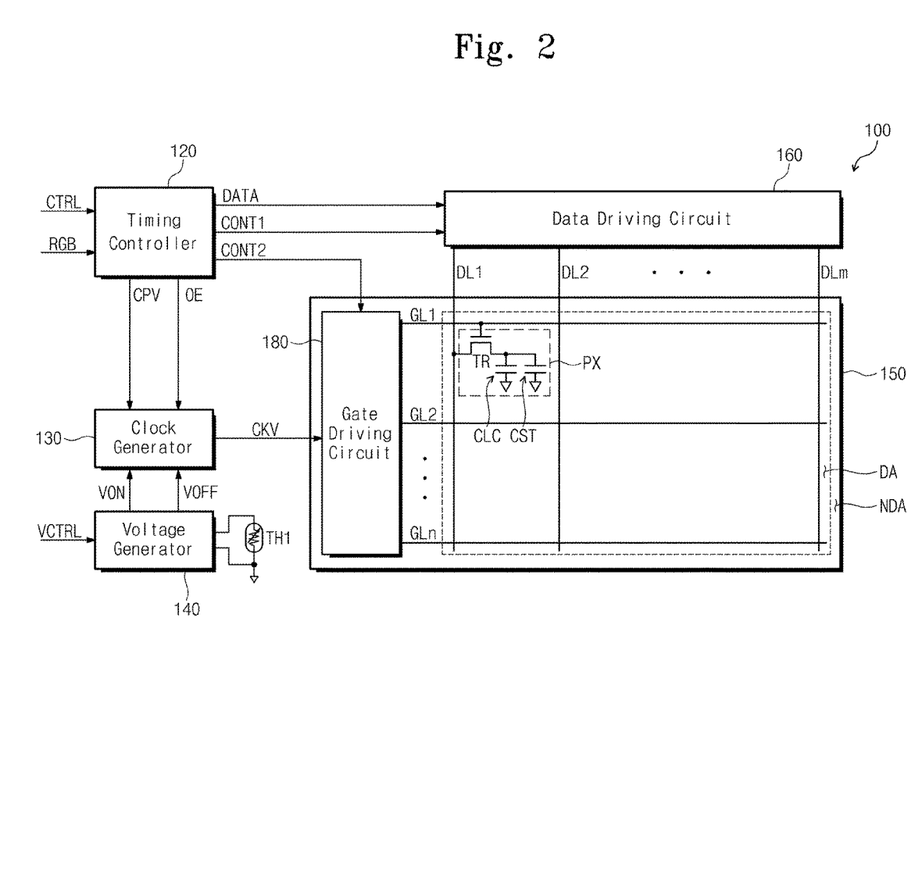
FIG. 2 is a block diagram showing an exemplary circuit configuration of the display apparatus shown in FIG. 1.

FIG. 2 is a block diagram showing an exemplary circuit configuration of the display apparatus shown in FIG. 1.

Referring to FIG. 2, the display apparatus 100 includes the timing controller 120, the clock generator 130, the voltage generator 140, the display panel 150, a data driving circuit 160, and the gate driving circuit 180.

The display panel 150 includes the display area DA and the non-display area NDA. The display area DA includes a plurality of data lines DL1 to DLm, a plurality of gate lines GL1 to GLn crossing the data lines DL1 to DLm, and a plurality of pixels PX arranged in a matrix form in areas defined by the data lines DL1 to DLm crossing the gate lines GL1 to GLn. The data lines DL1 to DLm are insulated from the gate lines GL1 to GLn. Each pixel PX includes a switching transistor TR connected to a corresponding gate line of the gate lines GL1 to GLn and a corresponding data line of the data lines DL1 to DLm, a liquid crystal capacitor CLC, and a storage capacitor CST.

The gate driving circuit 180 may be disposed at one side of the non-display area NDA in the display panel 150. The gate driving circuit 180 drives the gate lines GL1 to GLn in response to a second control signal CONT2 applied from the timing controller 120 and a gate clock signal CKV applied from the clock generator 130.

The timing controller 120 receives an image signal RGB and control signals CTRL, including a vertical synchronization signal, a horizontal synchronization signal, a main clock signal, a data enable signal, etc. to control a display of the image signal RGB from an external source. The timing controller 120 may convert a data format of the image signal RGB to a data format appropriate to a driving condition of the display panel 150 based on the control signals CTRL to obtain a data signal DATA, and applies the data signal DATA and a first control signal CONT1 to the data driving circuit 160. The timing controller 120 applies the second control signal CONT2 to the gate driving circuit 180. The first control signal CONT1 may include a horizontal synchronization start signal, a clock signal, and a line latch signal, and the second control signal CONT2 may include a vertical synchronization start signal. The timing controller 120 applies a gate pulse signal CPV and an output enable signal OE to the clock generator 130.

The clock generator 130 outputs the gate clock signal CKV, which swings between a gate-on voltage VON and a gate-off voltage VOFF, in response to the gate pulse signal CPV and the output enable signal OE from the timing controller 120.

The data driving circuit 160 includes the data driving circuits 161 to 164 as shown in FIG. 1. The data driving circuit 160 outputs gray-scale voltages to drive the data lines DL1 to DLm in response to the data signal DATA and the first control signal CONT1 from the timing controller 120.

When the gate driving circuit 180 applies a gate driving signal of the gate-on voltage VON to one gate line of the gate lines GL1 to GLn by, the switching transistor TR connected to the one gate line is turned on, and the gray-scale voltages are applied to the data lines DL1 to DLm from the data driving circuit 160. A period which the gate-on voltage VON is applied to the one gate line and turning on the switching transistor TR connected to the one gate line is referred to as a 1 horizontal period or 1 H.

The gate driving circuit 180 disposed at the one side of the display panel 150 includes a plurality of transistors. A mobility of electrons in the transistors of the gate driving circuit 180 may be influence by the surrounding temperature. More specifically, when the surrounding temperature increases, the mobility of electrons in the transistors increase, and when the surrounding temperature decreases, the mobility of electrons in the transistors decrease. Since a driving capability of the transistors is affected by the mobility of electrons, the mobility of electrons may be compensated for a high speed operation of the display apparatus.

The voltage generator 140 generates the gate-on voltage VON and the gate-off voltage VOFF to drive the clock generator 130. The voltage generator 140 may be connected to the thermistor TH1. The voltage generator 140 generates the gate-on voltage VON having a voltage level corresponding to a resistance value of the thermistor TH1 depending on the surrounding temperature. In the present exemplary embodiment, the thermistor TH1 is a negative temperature coefficient (NTC) thermistor.

Since the NTC thermistor has the negative temperature coefficient, the resistance value increases when the surrounding temperature decreases. The voltage generator 140 increases the voltage level of the gate-on voltage VON when the surrounding temperature becomes lower than ambient temperature. The gate-on voltage VON is used to turn on the transistors of the gate driving circuit 180. When the surrounding temperature is lower than the ambient temperature, the driving capability of the transistors in the gate driving circuit 180 may be improved by increasing the voltage level of the gate-on voltage VON.

Figure 3:
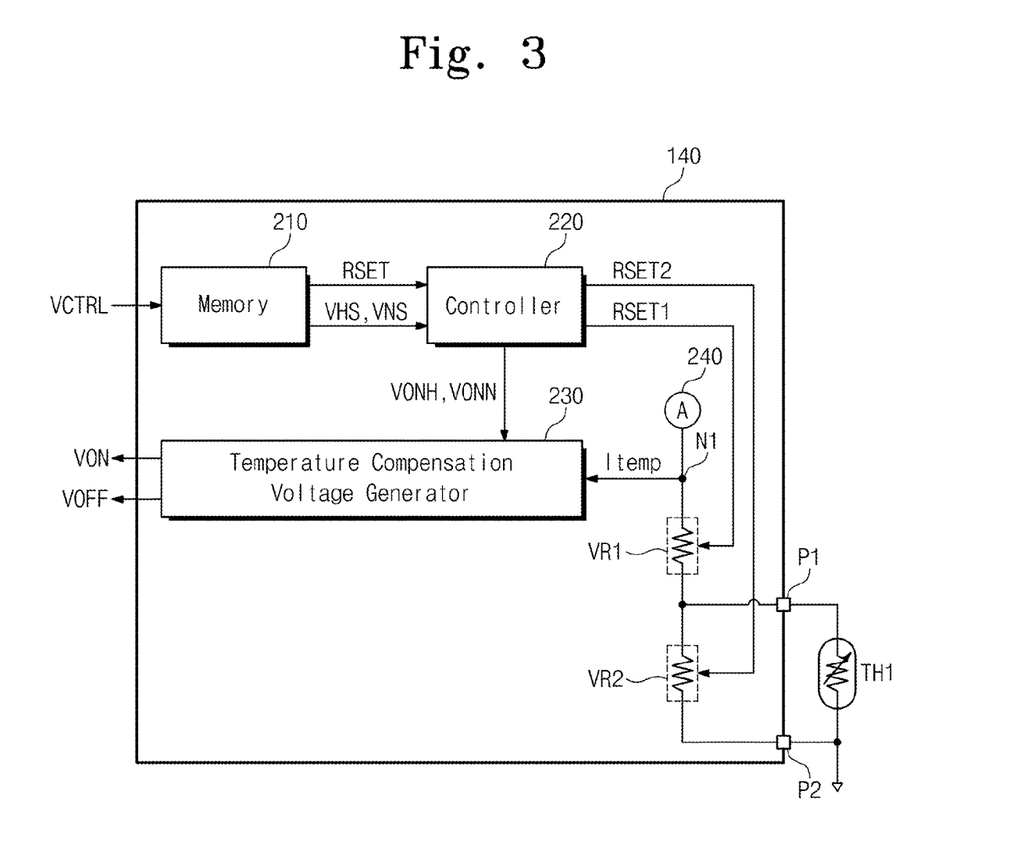
FIG. 3 is a block diagram showing an exemplary circuit configuration of a voltage generator shown in FIG. 2.

FIG. 3 is a block diagram showing an exemplary circuit configuration of the voltage generator shown in FIG. 2.

Referring to FIG. 3, the voltage generator 140 includes a memory 210, a controller 220, a temperature compensation voltage generator 230, a current source 240, a first variable resistor VR1, and a second variable resistor VR2.

The memory 210 stores a voltage control signal VCTRL received from an external source. The voltage control signal VCTRL includes a resistance value set signal RSET to change resistance values of the first variable resistor VR1 and the second variable resistor VR2, and a highest voltage signal VHS and a normal voltage signal VNS to respectively set a highest voltage and a normal voltage of the temperature compensation voltage generator 230. The memory 210 may be a non-volatile memory, such as an ultra-violet erasable programmable read only memory (UVEPROM), an electrically erasable and programmable read only memory (EEPROM), a flash memory, a magnetoresistive random-access memory (MRAM), a phase-change memory (PRAM), etc.

The controller 220 outputs a first resistance value set signal RSET1 and a second resistance value set signal RSET2 to control the first variable resistor VR1 and the second variable resistor VR2, respectively, in response to the resistance value set signal RSET stored in the memory 210. Meanwhile, the controller 220 applies a highest voltage set signal VONH and a normal voltage set signal VONN to the temperature compensation voltage generator 230 in response to the highest voltage signal VHS and the normal voltage signal VNS stored in the memory 210.

The first variable resistor VR1 is connected between the current source 240 and a first terminal P1, and is set to have a resistance value corresponding to the first resistance set signal RSET1. The second variable resistor VR2 is connected between the first terminal P1 and a second terminal P2, and is set to have a resistance value corresponding to the second resistance set signal RSET2.

Figure 4:
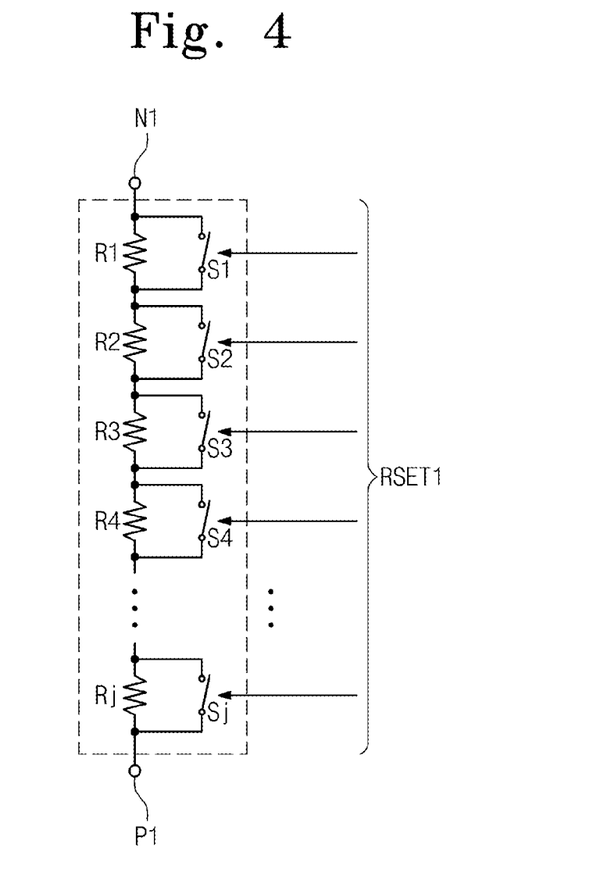
FIG. 4 is an exemplary circuit diagram showing a first variable resistor shown in FIG. 3.

FIG. 4 is an exemplary circuit diagram showing the first variable resistor VR1 shown in FIG. 3.

Referring to FIG. 4, the first variable resistor VR1 includes a plurality of resistors R1 to Rj sequentially connected in series between a first node N1 and the first terminal P1 and a plurality of switching devices S1 to Sj connected in parallel to the resistors R1 to Rj, respectively. Each of the switching devices S1 to Sj is operated in response to the first resistance value set signal RSET1. The first resistance value set signal RSET1 may be a digital signal consisting of bits respectively corresponding to the switching devices S1 to Sj. The resistors R1 to Rj may have the identical resistance value or different resistance values from each other.

The second variable resistor VR2 shown in FIG. 3 may have the same configuration as that of the first variable resistor VR1 shown in FIG. 4. However, the configuration of the first and second variable resistors VR1 and VR2 should not be limited to the configuration shown in FIG. 4

Referring back to FIG. 3, the temperature compensation voltage generator 230 receives a temperature variable current Itemp through the first node N1, to which the first variable resistor VR1 and the current source 240 are connected, and receives the highest voltage set signal VONH and the normal voltage set signal VONN from the controller 220. The temperature compensation voltage generator 230 generates the gate-on voltage VON having a voltage level between the highest voltage VH corresponding to the highest voltage set signal VONH and the normal voltage VN corresponding to the normal voltage set signal VONN. More specifically, the temperature compensation voltage generator 230 generates the gate-on voltage VON having the voltage level corresponding to the temperature variable current Itemp.

The thermistor TH1 is electrically connected to the first and second terminals P1 and P2 of the voltage generator 140, which may be realized as an integrated circuit. In the exemplary embodiment, the thermistor TH1 may be the NTC thermistor in which the resistance value thereof increases when the temperature is lowered. When the temperature decreases, the resistance value of the thermistor TH1 increases, and an amount of the temperature variable current Itemp may increase. When the current amount of the temperature variable current Itemp increases, the temperature compensation voltage generator 230 increases the voltage level of the gate-on voltage VON.

Figure 5:
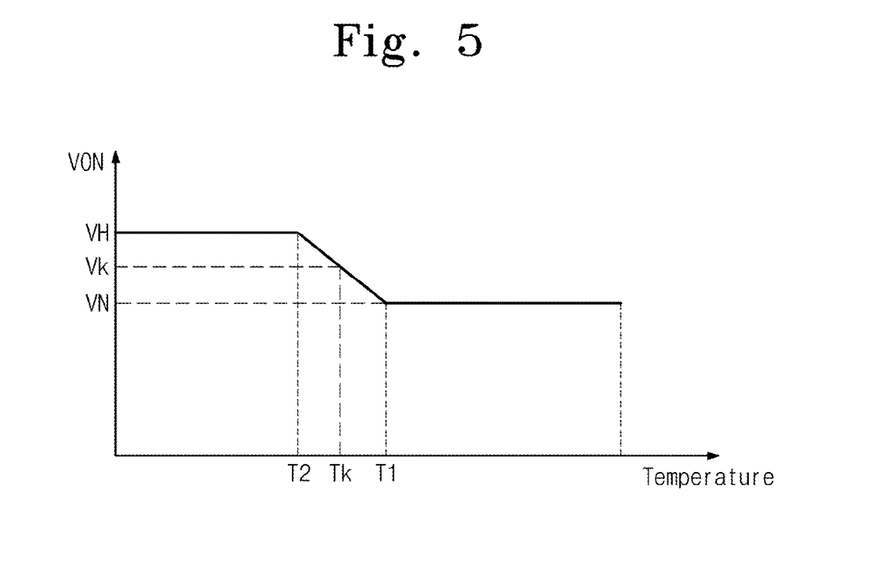
FIG. 5 is a graph showing a change in a voltage level of a gate-on voltage generated by a temperature compensation voltage generator shown in FIG. 3 versus a surrounding temperature according to an exemplary embodiment of the present disclosure.

FIG. 5 is a graph showing a change in a voltage level of the gate-on voltage VON generated by the temperature compensation voltage generator shown in FIG. 3 versus the surrounding temperature according to an exemplary embodiment of the present disclosure.

Referring to FIGS. 3 and 5, the temperature compensation voltage generator 230 generates the gate-on voltage VON having the voltage level between the highest voltage VH corresponding to the highest voltage set signal VONH and the normal voltage VN corresponding to the normal voltage set signal VONN. The temperature compensation voltage generator 230 generates the gate-on voltage VON having the voltage level of the normal voltage VN corresponding to the normal voltage set signal VONN at the ambient temperature Tk. For example, the ambient temperature Tk may be between a minimum temperature T2 (e.g., 15° C.) and a maximum temperature T1 (e.g., 25° C.). When the surrounding temperature decreases and the resistance value of the thermistor TH1 is increased, the temperature variable current Itemp increases, thereby increasing the voltage level of the gate-on voltage VON. A maximum voltage level of the gate-on voltage VON is the highest voltage VH. That is, the maximum voltage level of the gate-on voltage VON is set to the highest voltage VH even when the surrounding temperature is lower than the minimum temperature T2.

Here, the slope of the voltage level of the gate-on voltage VON versus the surrounding temperature changes depending on the resistance values of the first variable resistor VR1 and the second variable resistor VR2. Thus, the resistance values of the first and second variable resistors VR1 and VR2 may be set to appropriate value according to the characteristics of the display apparatus 100.

Figure 6:
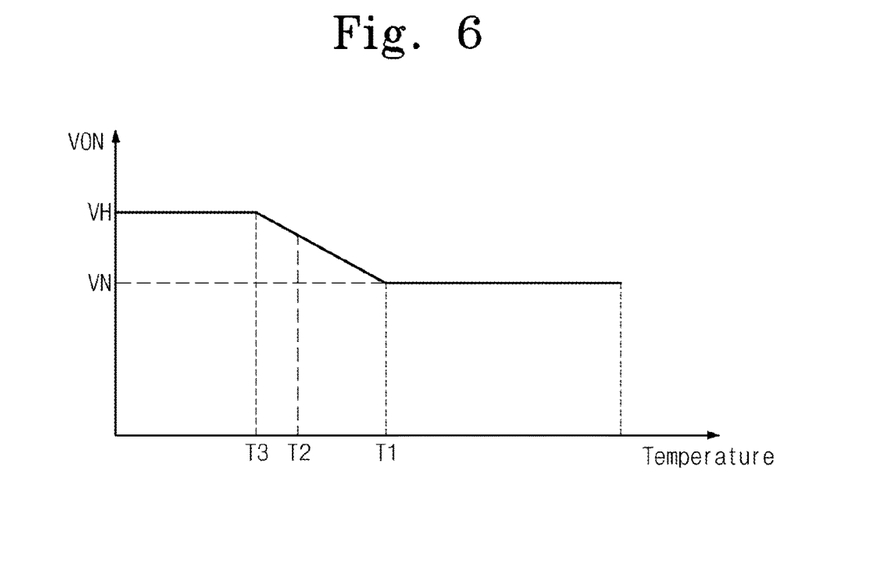
FIG. 6 is a graph showing a change in a voltage level of a gate-on voltage generated by a temperature compensation voltage generator shown in FIG. 3 versus a surrounding temperature according to another exemplary embodiment of the present disclosure.

FIG. 6 is a graph showing a change in a voltage level of the gate-on voltage VON generated by the temperature compensation voltage generator shown in FIG. 3 versus the surrounding temperature according to another exemplary embodiment of the present disclosure.

Referring to FIGS. 3, 5, and 6, the slope of the voltage level of the gate-on voltage VON versus the surrounding temperature may be changed by adjusting the resistance values of the first variable resistor VR1 and the second variable resistor VR2. More specifically, when the surrounding temperature is lower than the minimum value T3, the maximum voltage level of the gate-on voltage VON is set to the highest voltage VH.

The voltage generator 140 may adjust the resistance values of the first variable resistor VR1 and the second variable resistor VR2 by changing the resistance value set signal RSET stored in the memory 210. Since the first variable resistor VR1 and the second variable resistor VR2 are included in the voltage generator 140, the number of components mounted on the circuit board 110 shown in FIG. 1 may be decreased.

Figure 7:
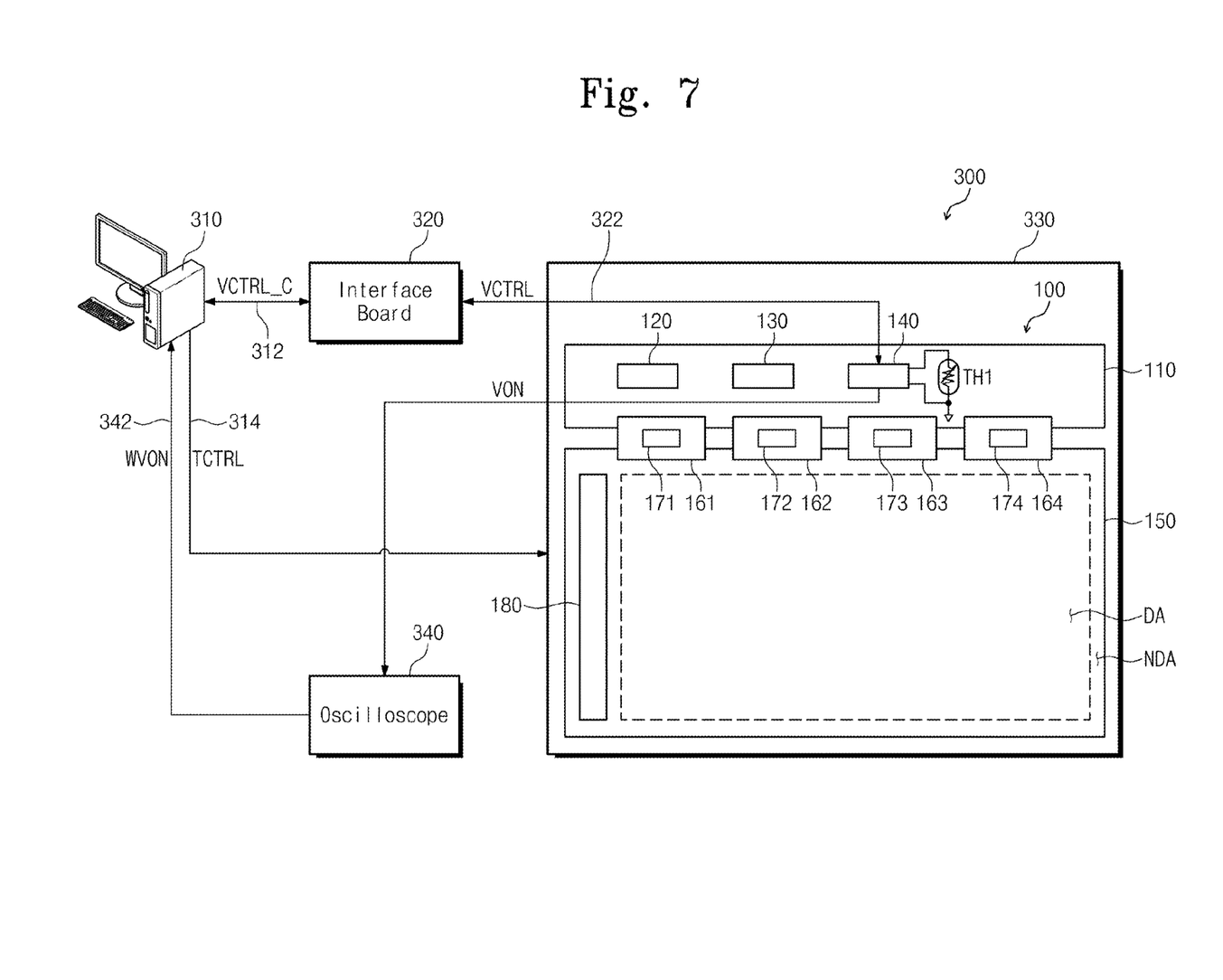
FIG. 7 is a block diagram showing a test system to set characteristics of first and second variable resistors in the voltage generator of the display apparatus according to an exemplary embodiment of the present disclosure.

FIG. 7 is a block diagram showing a test system to set characteristics of the first and second variable resistors in the voltage generator of the display apparatus according to an exemplary embodiment of the present disclosure.

Referring to FIG. 7, a test system 300 includes a computer 310, an interface board 320, a temperature chamber 330, and an oscilloscope 340. The computer 310 outputs a temperature control signal TCTRL to control a temperature of the temperature chamber 330 and a voltage control signal VCTRL_C to control the voltage generator 140 in the display apparatus 100.

The interface board 320 is connected between the computer 310 and the voltage generator 140 in the display apparatus 100. The computer 310 may be connected to the interface board 320 through serial interfaces 312 such as a universal serial bus (USB). The interface board 320 may be connected to the voltage generator 140 in the display apparatus 100 through serial interfaces such as an inter-integrated circuit (I²C). The interface board 320 converts the voltage control signal VCTRL_C in the universal serial bus (USB) type received from the computer 310 to the voltage control signal VCTRL in the inter-integrated circuit (I²C) interface type.

The temperature chamber 330 sets the temperature in the temperature chamber 330 in response to the temperature control signal TCTRL from the computer 310. An interface 314 between the computer 310 and the temperature chamber 330 may be USB, a transfer control protocol/internet protocol (TCP/IP), and a communication interface provided from the temperature chamber 330.

The oscilloscope 340 measures the gate-on voltage VON generated from the voltage generator 140 and provides a wave information WVON about the gate-on voltage VON to the computer 310.

In response to the wave information WVON generated from the gate-on voltage VON from the oscilloscope 340 corresponding to the temperature change in the temperature chamber 330, the computer 310 outputs the voltage control signal VCTRL_C to change the gate-on voltage VON generated from the voltage generator 140.

Figure 8:
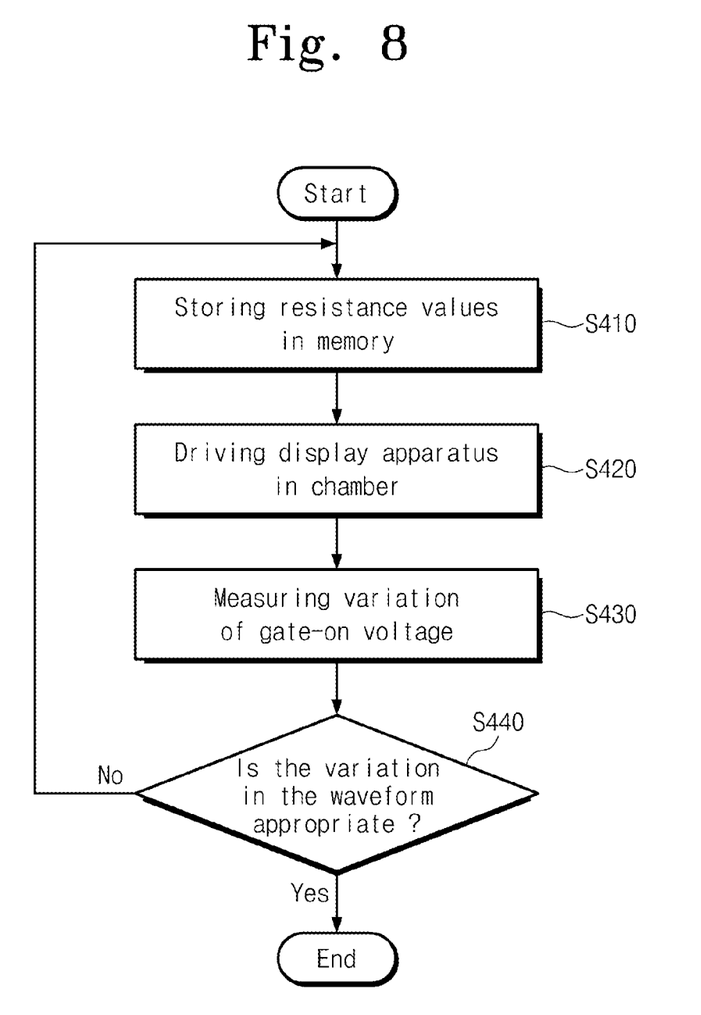
FIG. 8 is a flowchart showing an operation of the test system shown in FIG. 7.

FIG. 8 is a flowchart showing an operation of the test system shown in FIG. 7.

Referring to FIGS. 3, 7, and 8, the computer 310 outputs the voltage control signal VCTRL_C to change the gate-on voltage VON. The interface board 320 converts the voltage control signal VCTRL_C to the voltage control signal VCTRL and provides the voltage control signal VCTRL to the voltage generator 140 of the display apparatus 100. The voltage control signal VCTRL is stored in the memory 210 (S410). The voltage control signal VCTRL includes the resistance values of the first variable resistor VR1 and the second variable resistor VR2. The controller 220 reads out the resistance set signal RSET from the memory 210 and outputs the first resistance set signal RSET1 to set the resistance value of the first variable resistor VR1 and the second resistance set signal RSET2 to set the resistance value of the second variable resistor VR2.

The computer 310 outputs the temperature control signal TCTRL to set the temperature in the temperature chamber 330 to be the ambient temperature (S420). The display apparatus 100 is driven in the temperature chamber 330 at the ambient temperature. After the display apparatus 100 is driven during a predetermined period (for instance, about 30 minutes) in the temperature chamber 330 at the ambient temperature, the computer 310 outputs the temperature control signal TCTRL to change the temperature in the temperature chamber 330. The oscilloscope 340 provides the wave information WVON corresponding to the variation in the voltage level of the gate-on voltage VON generated by the voltage generator 140 to the computer 310 (S430).

The computer 310 checks whether the variation in the waveform of the gate-on voltage VON from the temperature change is appropriate, based on the wave information WVON received from the oscilloscope 340 (S440). In the case that the variation in the waveform of the gate-on voltage VON is inappropriate, the computer 310 again outputs the voltage control signal VCTRL_C to change the resistance values of the first variable resistor VR1 and the second variable resistor VR2.

After the steps from S410 to S440 are repeatedly performed, when the computer 310 checks that the variation in waveform of the gate-on voltage VON is appropriate, the control operation performed to set the resistance values of the first variable resistor VR1 and the second variable resistor VR2 is finished.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A voltage generation integrated circuit, comprising:
a first variable resistor connected between a current source and a first terminal;
a second variable resistor connected between the first terminal and a second terminal;
a memory configured to store a resistance value set;
a controller configured to change resistance value of the first and second variable resistors referring to the resistance value set stored in the memory; and
a voltage generator connected to one end of the first variable resistor and is configured to receive an input current corresponding to the resistance value of the first variable resistor and generate a gate-on voltage corresponding to the input current.

2. The voltage generation integrated circuit of claim 1, further comprising a thermistor connected to the first terminal and the second terminal.

3. The voltage generation integrated circuit of claim 1, wherein the controller is configured to output a first resistance value set signal to set the resistance value of the first variable resistor and a second resistance value set signal to set the resistance value of the second variable resistor.

4. The voltage generation integrated circuit of claim 1, wherein the voltage generator is configured to receive a current of a connection node between the current source and the first variable resistor as the input current.

5. The voltage generation integrated circuit of claim 1, wherein the memory is further configured to store a highest voltage data and a normal voltage data for setting a highest voltage and a normal voltage of the gate-on voltage, respectively.

6. The voltage generation integrated circuit of claim 5, wherein the controller is further configured to provide a highest voltage set signal and a normal voltage set signal to the voltage generator according to the highest voltage data and the normal voltage data stored in the memory.

7. The voltage generation integrated circuit of claim 6, wherein the voltage generator is configured to generate the gate-on voltage having a value between the highest voltage corresponding to the highest voltage set signal and a lowest voltage corresponding to the normal voltage set signal as the gate-on voltage in response to the input current.

8. The voltage generation integrated circuit of claim 6, wherein the voltage generator is configured to generate the gate-on voltage having a value between the highest voltage corresponding to the highest voltage set signal and the lowest voltage corresponding to the normal voltage set signal, and the gate-on voltage is inversely proportional to a surrounding temperature sensed by the thermistor.

9. The voltage generation integrated circuit of claim 1, wherein the memory is an electrically erasable and programmable read-only memory.

10. A display apparatus, comprising:
a display panel comprising a plurality of gate lines, a plurality of data lines, and a plurality of pixels connected to the gate lines and the data lines;
an image display controller configured to convert an image signal received from an external source to a data signal and configured to control the display panel to display an image on the display panel; and
a voltage generator configured to generate a voltage to drive the image display controller,
wherein the voltage generator comprises:
a first variable resistor connected between a current source and a first terminal;
a second variable resistor connected between the first terminal and a second terminal;
a memory configured to store a resistance value set;
a controller configured to change resistance value of the first and second variable resistors referring to the resistance value set stored in the memory; and
a voltage generator connected to one end of the first variable resistor and is configured to receive an input current corresponding to the resistance value of the first variable resistor and generate a gate-on voltage corresponding to the input current.

11. The display apparatus of claim 10, wherein the voltage generator is realized as an integrated circuit.

12. The display apparatus of claim 10, further comprising a thermistor connected to the first terminal and the second terminal of the voltage generator.

13. The display apparatus of claim 12, wherein the controller is configured to output a first resistance value set signal to set a resistance value of the first variable resistor and a second resistance value set signal to set a resistance value of the second variable resistor.

14. The display apparatus of claim 13, wherein the voltage generator is configured to receive a current of a connection node between the current source and the first variable resistor as the input current.

15. A display apparatus, comprising:
- a display panel comprising a plurality of gate lines, a plurality of data lines, and a plurality of pixels connected to the gate lines and the data lines;
- an image display controller configured to convert an image signal received from an external source to a data signal and configured to control the display panel to display an image on the display panel; and
- a voltage generator configured to generate a voltage to drive the image display controller,
- wherein the voltage generator comprises:
- at least one resistor;
- a memory configured to store a resistance value set;
- a controller configured to change a resistance value of the resistor referring to the resistance value set stored in the memory; and
- a voltage generator connected to one end of the one resistor and configured to receive an input current corresponding to the resistance value of the one resistor and generate a gate-on voltage corresponding to the input current,
- wherein the memory is further configured to store a highest voltage data and a normal voltage data of the gate-on voltage, and
- wherein the controller is further configured to provide a highest voltage set signal and a normal voltage set signal to the voltage generator according to the highest voltage data and the normal voltage data stored in the memory.

16. The display apparatus of claim 15, wherein the voltage generator is configured to generate the gate-on voltage having a value between the highest voltage corresponding to the highest voltage set signal and a lowest voltage corresponding to the normal voltage set signal, and the voltage generator generates the gate-on voltage in response to the input current that is inversely proportional to a surrounding temperature sensed by the thermistor.

* * * * *